(12) United States Patent
Kim

(10) Patent No.: US 8,923,056 B2
(45) Date of Patent: Dec. 30, 2014

(54) NON-VOLATILE MEMORY DEVICE FOR REDUCING OPERATING TIME AND METHOD OF OPERATING THE SAME

(75) Inventor: Min Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 138 days.

(21) Appl. No.: 13/618,766

(22) Filed: Sep. 14, 2012

(65) Prior Publication Data

US 2013/0088919 A1 Apr. 11, 2013

(30) Foreign Application Priority Data

Oct. 5, 2011 (KR) ........................ 10-2011-0101384

(51) Int. Cl.
*G11C 16/04* (2006.01)
*G11C 16/34* (2006.01)
*G11C 16/26* (2006.01)

(52) U.S. Cl.
CPC ............ *G11C 16/3459* (2013.01); *G11C 16/26* (2013.01)
USPC ........... 365/185.12; 365/185.11; 365/185.14; 365/185.19; 365/185.21; 365/185.22

(58) Field of Classification Search
USPC ............ 365/185.11, 185.12, 185.14, 185.19, 365/185.21, 185.22
See application file for complete search history.

(56) References Cited

U.S. PATENT DOCUMENTS

| 2008/0291739 A1* | 11/2008 | Lee et al. | 365/185.22 |
| 2010/0315880 A1* | 12/2010 | Joo | 365/185.22 |
| 2011/0141817 A1* | 6/2011 | Takagiwa | 365/185.22 |
| 2012/0008402 A1* | 1/2012 | Park | 365/185.18 |

* cited by examiner

*Primary Examiner* — Hoai V Ho
(74) *Attorney, Agent, or Firm* — IP & T Group LLP

(57) ABSTRACT

A non-volatile memory device includes a memory cell block including a plurality of memory cells, a plurality of page buffer groups including a plurality of page buffers coupled to bit lines of the memory cell block, a pass/fail check circuit coupled to the plurality of page buffers and configured to perform a pass/fail check operation of comparing a total amount of current varying according to verify data sensed from the memory cells and stored in the page buffers with an amount of reference current corresponding to the number of allowed bits, and a control circuit configured to control the pass/fail check circuit by stopping, when a fail signal is generated during the pass/fail check operation currently being performed on a page buffer group among the plurality of page buffer groups, the pass/fail check operation on the remaining page buffer groups.

21 Claims, 5 Drawing Sheets

NON-VOLATILE MEMORY DEVICE FOR REDUCING OPERATING TIME AND METHOD OF OPERATING THE SAME

CROSS-REFERENCE TO RELATED APPLICATION

Priority is claimed to Korean patent application number 10-2011-0101384 filed on Oct. 5, 2011, the entire disclosure of which is incorporated herein by reference in its entirety.

BACKGROUND

1. Field of Invention

Embodiments of the present invention relate to a non-volatile memory device and a method of operating the same, more particularly, to a non-volatile memory device capable of reducing program time and a method of operating the same.

2. Description of Related Art

Recently, non-volatile memory devices that can be electrically programmed and erased and do not require a refresh function for rewriting data at predetermined intervals are in demand.

A non-volatile memory device may apply a program pulse to word lines of memory cells during a program operation and subsequently perform a pass/fail check operation to check whether the memory cells have been programmed or not by using page buffers coupled to the memory cells.

During the above-described pass/fail check operation, a target page for the program operation is divided into a plurality of regions, and the number of fail bits is sequentially counted in each of the regions of the target page to check whether a fail (that is, a failure to program) that may allow for error correction has occurred in each region. When the number of fail bits is smaller than the number of error correction code (ECC) bits in each region, the program operation is completed. On the other hand, when the number of fail bits is greater than the number of ECC bits in at least one region, the program operation is terminated by determining that the program operation has been unsuccessful.

As for the above-described program operation in the conventional non-volatile memory device, when a pass/fail check operation is performed on a plurality of buffer groups in a sequential manner, the pass/fail check operation continues to be performed sequentially until the last region even if a fail has occurred in the first region, thereby resulting in additional operating time.

BRIEF SUMMARY

An embodiment relates to a non-volatile memory device capable of reducing an operating time by performing a pass/fail check operation on a plurality of page buffer groups in a sequential manner and skipping, if at least one of the page buffer groups is determined to a fail, the pass/fail check operation on the remaining page buffer groups, and a method of operating the same.

A non-volatile memory device according to an embodiment of the present invention includes a memory cell block including a plurality of memory cells, a plurality of page buffer groups including a plurality of page buffers coupled to bit lines of the memory cell block, a pass/fail check circuit coupled to the plurality of page buffers and configured to perform a pass/fail check operation of comparing a total amount of current varying according to verify data sensed from the memory cells and stored in the page buffers with an amount of reference current corresponding to the number of allowed bits, and a control circuit configured to control the pass/fail check circuit by stopping, when a fail signal is generated during the pass/fail check operation currently being performed on a page buffer group among the plurality of page buffer groups, the pass/fail check operation on the remaining page buffer groups during a period that the pass/fail check operation is to be sequentially performed on the plurality of page buffers.

A non-volatile memory device according to another embodiment of the present invention includes a memory cell block including a normal memory cell array and a flag cell array, a page buffer section including a plurality of page buffer groups coupled to the normal memory cell array and a flag page buffer group coupled to the flag cell array, a pass/fail check circuit coupled to the page buffer section and configured to sequentially perform a pass/fail check operation on the flag page buffer group and the plurality of page buffer groups, and a control circuit configured to control the pass/fail check circuit by stopping, when a page buffer group determined to be a fail is detected among the plurality of page buffer groups during the pass/fail check operation on the flag page buffer group and the plurality of page buffer groups, the pass/fail check operation on the remaining page buffer groups.

A method of operating a non-volatile memory device according to an embodiment of the present invention includes storing verify data of memory cells included in pages of a memory cell block in a plurality of page buffer groups, performing a pass/fail check operation by selecting the plurality of page buffer groups in a sequential manner, and stopping, when a page buffer groups determined to be a fail is detected among the plurality of page buffer groups during the pass/fail check operation, the pass/fail check operation on the remaining page buffer groups.

DESCRIPTION OF EMBODIMENTS

Figure 1:
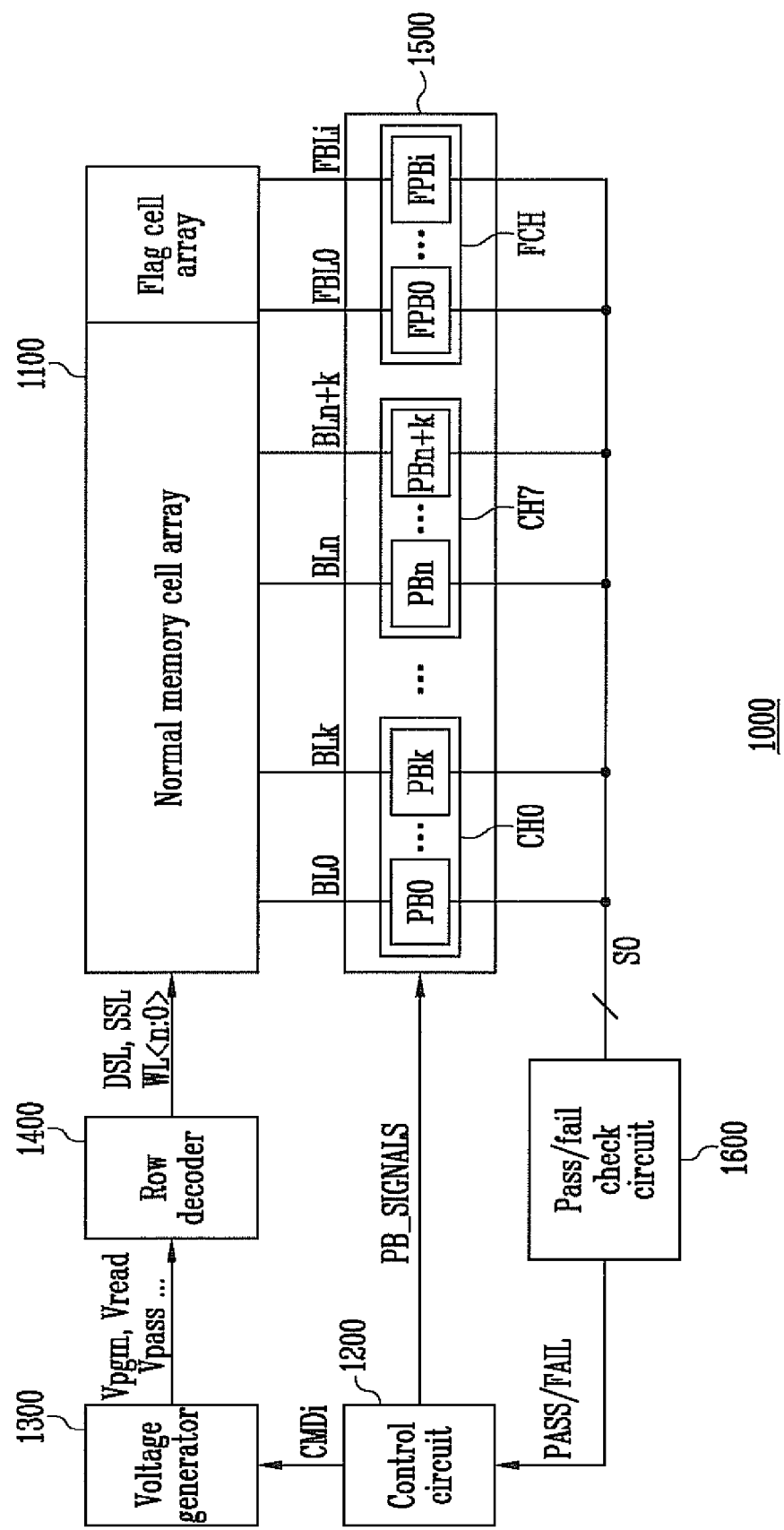
FIG. 1 a view illustrating the configuration of a non-volatile memory device according to an embodiment of the present invention.

Hereinafter, various embodiments of the present disclosure will be described in detail with reference to the accompanying drawings. The figures are provided to enable those of ordinary skill in the art to make and use the present invention according to the exemplary embodiments of the present invention. In addition, like or similar reference numerals denote parts performing similar functions and actions throughout the drawings.

FIG. 1 is a view illustrating the configuration of a semiconductor memory device according to an embodiment of the present invention.

Referring to FIG. 1, a non-volatile memory device 1000 includes a memory block 1100 having a normal memory cell array and a flag cell array, operation circuits (1300 to 1500) configured to perform a program operation, a read operation and an erase operation for data input and output of memory cells included in a selected page of the memory block 1100, a pass/fail check circuit 1600, and a control circuit 1200 configured to control the operation circuits (1300 to 1500) and the pass/fail check circuit 1600. The operation circuits may include a voltage generator 1300, a row decoder 1400 and a page buffer section 1500.

The voltage generator 1300 generates and outputs a plurality of operating voltages including a program voltage Vpgm, a read voltage Vread and a pass voltage Vpass in response to a control signal CMDi being output from the control circuit 1200.

The row decoder 1400 transfers the operating voltages generated by the voltage generator 1300 to word lines WL<n: 0>, a drain select line DSL and a source select line SSL of the memory block 1100.

The page buffer section 1500 includes a plurality of page buffers PB0 to PBn+k coupled to bit lines BL0 to BLn+k of the normal memory cell array, respectively, and a plurality of flag page buffers FPB0 to FPBi coupled to bit lines FBL0 to FBLi of the flag cell array, respectively. The plurality of page buffers PB0 to PBn+k may be divided into a plurality of page buffer groups. The page buffer groups may have the same number of page buffers as each other.

For example, in this embodiment of the present invention, the plurality of page buffers PB0 to PBn+k coupled to the bit lines BL0 to BLn+k of the normal memory cell array, respectively, may be divided into eight page buffer groups CH0 to CH7. More specifically, the first page buffer group CH0 may include the plurality of page buffers PB0 to PBk, while the eighth page buffer group CH7 may include the plurality of page buffers PBn to PBn+k. In addition, the plurality of flag page buffers FPB0 to FPBi may be grouped into a single flag cell page buffer group FCH.

During a pass/fail check operation, each of the plurality of page buffers PB0 to PBn+k and each of the plurality of flag page buffers FPB0 to FPBi may store verify data according to a program state of the corresponding normal memory cells or flag cells and subsequently maintain a potential of a sense node SO, included in the page buffer, at a high level or change the potential to a low level in response to the verify data. When the program state of the corresponding memory cells is determined to be a pass, the verify data of '1' is input to the page buffer, and the potential of the sense node shifts to a low level. On the other hand, when the program state of the corresponding memory cells is determined to be a fail, the verify data of '0' is input to the page buffer, and the potential of the sense node is maintained at a high level. Operations of the page buffer during the pass/fail check operation will be described below.

The pass/fail check circuit 1600 compares the amount of measurement current flowing through a current path being controlled by levels of the potential of the sense node SO of each of the page buffers of the page buffer section 1500 with the amount of reference current corresponding to the number of allowed bits that can be processed by an error correction code (ECC) circuit to thereby output a pass or fail signal PASS or FAIL.

For example, when the amount of measurement current is greater than the amount of reference current, the pass/fail check circuit 1600 may output the fail signal FAIL. In contrast, when the amount of measurement current is smaller than the amount of reference current, the pass/fail check circuit 1600 may output the pass signal PASS. At this point, the pass/fail check circuit 1600 performs the pass/fail check operation on the page buffer groups of the page buffer section 1500 in a sequential manner. In addition, when even a single fail bit is detected during the pass/fail check operation on the flag cell page buffer group FCH, that is, when a sense node of a single flag page buffer is detected as being at a high level, it is determined that a result of the pass/fail check operation indicates a fail, and the pass/fail check circuit 1600 outputs the fail signal FAIL.

The control circuit 1200 checks whether the corresponding memory block is a failed memory block or not by determining whether the program operation is a fail or pass in response to the pass or fail signal PASS or FAIL output from the pass/fail check circuit 1600. The pass/fail check circuit 1600 performs the pass/fail check operation on the first page buffer group CH0 to the eighth page buffer group CH7 in a sequential manner and outputs the pass or fail signal PASS or FAIL in a sequential manner. At this point, if the fail signal FAIL is output as a result of the pass/fail check operation performed on at least one of the page buffer groups, the control circuit 1200 may skip the pass/check operation on the remaining page buffer groups.

In addition, when the fail signal FAIL is output since a result of performing the pass/fail check operation on the flag cell page buffer group FCH is determined to indicate a fail, the control circuit 1200 may skip the pass/check operation on the first to eighth page buffer groups.

Figure 2:
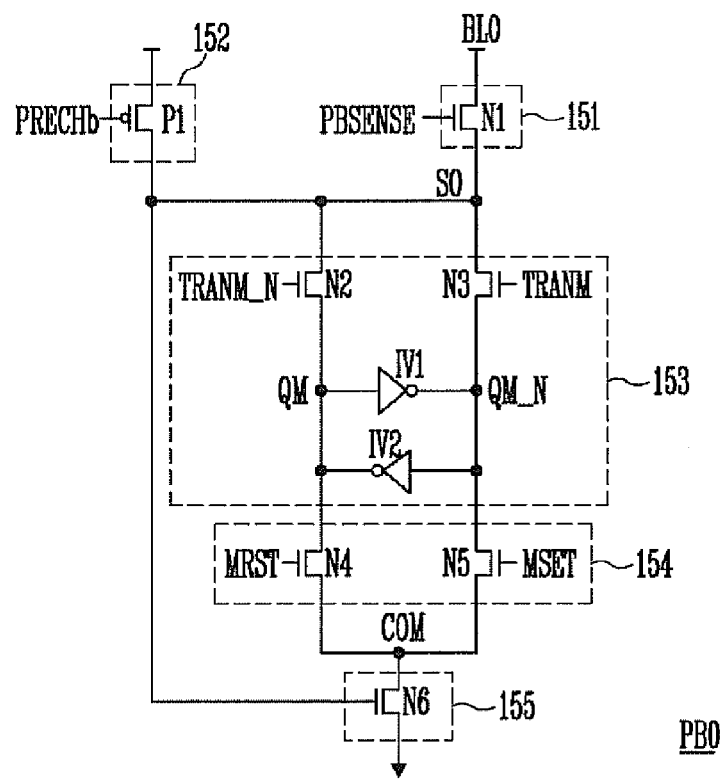
FIG. 2 is a detailed circuit diagram of one of a plurality of page buffers illustrated in FIG. 1.

FIG. 2 is a detailed circuit diagram of one of the plurality of page buffers illustrated in FIG. 1.

Referring to FIG. 2, the page buffer PB0 includes a bit line coupling circuit 151, a precharge circuit 152, a latch circuit 153, a data input circuit 154 and a sensing circuit 155.

The bit line coupling circuit 151 is coupled between the bit line BL0 and the sense node SO and configured to couple the bit line BL0 and the sense node SO in response to a coupling signal PBSENSE. The bit line coupling circuit 151 may be formed of an NMOS transistor N1.

The precharge circuit 152 is coupled between a power source terminal and the sense node SO and coupled to precharge the sense node SO to a power voltage level in response to a precharge signal PRECHb. The precharge circuit 152 may be formed of a PMOS transistor P1.

The latch circuit 153 is coupled to the sense node SO and coupled to change the potential of the sense node SO to a low level or a high level in response to the latched data. The latch circuit 153 may include inverters IV1 and IV2 coupled in parallel in opposite directions between a first node QM and a second node QM_N, an NMOS transistor N2 coupled between the first node QM and the sense node SO, and an NMOS transistor N3 coupled between the second node QM_N and the sense node SO. The NMOS transistor N2 is turned on in response to a first transfer signal TRANM_N, and the NMOS transistor N3 is turned on in response to a second transfer signal TRANM.

The data input circuit 154 is coupled between a common node COM and the first node QM and the second node QM_N of the latch circuit 153. In addition, the data input circuit 154 inputs data based on a potential of the common node COM to the latch circuit 153 in response to a first or second input signal MRST or MSET. The data input circuit 154 may include NMOS transistors N4 and N5. The NMOS transistor N4 is coupled between the first node QM and the common node COM and is turned on in response to the first input signal MRST. The NMOS transistor N5 is coupled between the second node QM_N and the common node COM and is turned on in response to the second input signal MSET.

The sensing circuit 155 is coupled between the common node COM and the ground terminal and is turned on or off depending on the potential of the sense node SO, thereby controlling the potential of the common node COM. The sensing circuit 155 may be formed of an NMOS transistor N6.

The verify data storing operation during the pass/fail check operation on the page buffers is described below.

The page buffer PB0 verifies and stores a program state of corresponding memory cells through the bit line BL0 coupled thereto. After the bit line BL0 is precharged to a high level, a verify voltage is applied to the word lines coupled to the memory cells. As a result, the potential of the bit line BL0 is maintained at a high level or discharged to a low level in response to the program state of the memory cells. At this point, program data programmed into the memory cells has been stored in a latch of the page buffer PB0. The program data and the potential of the bit line are compared with each other, and verify data representing a result of the comparison is stored in the latch of the page buffer PB0.

If, as a result of the comparison, the program operation is determined to be successful since the program data and the potential of the bit line BL0 correspond to each other, the verify data indicates that the potential of the second node QM_N becomes '1', that is, a high level. If, as a result of the comparison, the program operation is determined to be unsuccessful since the program data and the potential of the bit line BL0 do not correspond to each other, the verify data indicates that the potential of the second node QM_N becomes '0', that is, a low level.

After the sense node SO is precharged to a high level by using the precharge circuit 152, the first transfer signal TRANM_N at a high level is applied to couple the first node QM and the sense node SO to each other. Thus, the potential of the sense node SO is controlled according to the verify data latched in the latch circuit 153. More specifically, the sense node SO of a page buffer corresponding to memory cells determined to be successfully programmed is discharged to a low level, whereas the sense node SO of a page buffer corresponding to failed memory cells (that is, memory cells determined to be unsuccessfully programmed) is maintained at a high level.

Figure 3:
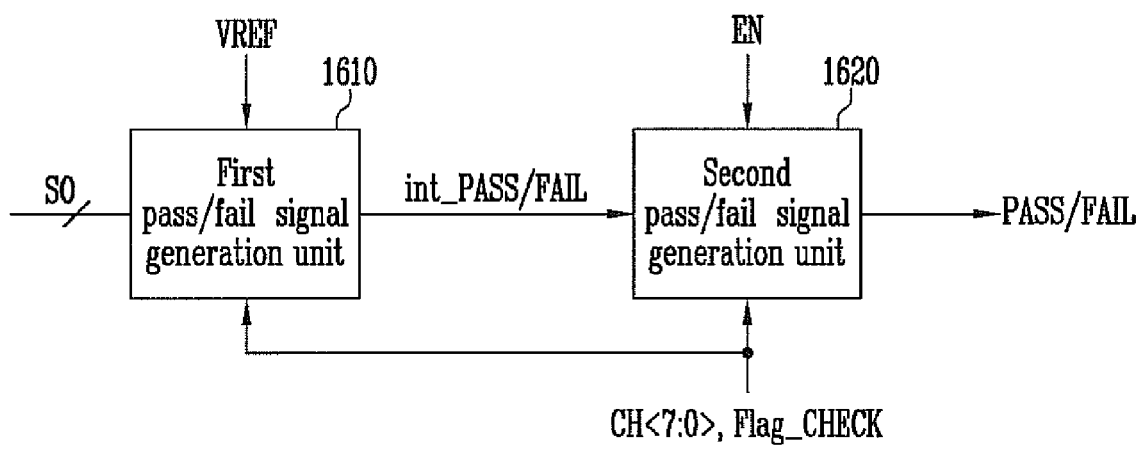
FIG. 3 is a view illustrating the configuration of a pass/fail check circuit of FIG. 1.

FIG. 3 is a view illustrating the configuration of the pass/fail check circuit of FIG. 1.

Referring to FIG. 3, the pass/fail check circuit 1600 includes a first pass/fail signal generation unit 1610 and a second pass/fail signal generation unit 1620.

The first pass/fail signal generation unit 1610 is coupled to the sense nodes SO of the page buffers PB0 to PBn+k and the flag page buffers FPB0 to FPBi of the page buffer section 1500. In addition, the first pass/fail signal generation unit 1610 compares the amount of measurement current flowing through the current path controlled by potential levels of the sense nodes SO in response to a reference verify voltage VREF with the amount of reference current corresponding to the number of allowed bits that can be processed by the ECC circuit to thereby output an internal pass/fail signal int_PASS or int_FAIL.

For example, if, as a result of the comparison, the amount of measurement current is greater than the amount of the reference current, the first pass/fail signal generation unit 1610 outputs the internal fail signal int_FAIL at a low level. If, as a result of the comparison, the amount of measurement current is smaller than the amount of the reference current, the first pass/fail signal generation unit 1610 outputs the internal pass signal int_PASS at a high level. The first pass/fail signal generation unit 1610 sequentially selects the first to eighth page buffer groups to perform the pass/fail check operation thereon. The first pass/fail signal generation unit 1610 outputs the internal pass/fail signal int_PASS or int_FAIL as a result of the pass/fail check operation performed on each of the page buffer groups.

The second pass/fail signal generation unit 1620 outputs the pass or fail signal PASS or FAIL in response to group selection signals CH<7:0> and Flag_CHECK and the internal pass/fail signal int_PASS or int_FAIL output from the first pass/fail signal generation unit 1610. More specifically, when the internal fail signal int_FAIL is generated as a result of performing the pass/fail check operation on at least one of the page buffer groups to output the internal pass/fail signal int_PASS/int_FAIL, the second pass/fail signal generation unit 1620 outputs the fail signal FAIL at a low level. In addition, any time that the internal fail signal int_FAIL is generated for the first time during the pass/fail check operation performed on the flag cell page buffer group and the first to eighth page buffer groups in a sequential manner, the second pass/fail signal generation unit 1620 outputs the fail signal FAIL at a low level by shifting the pass signal PASS at the high level.

Figure 4:
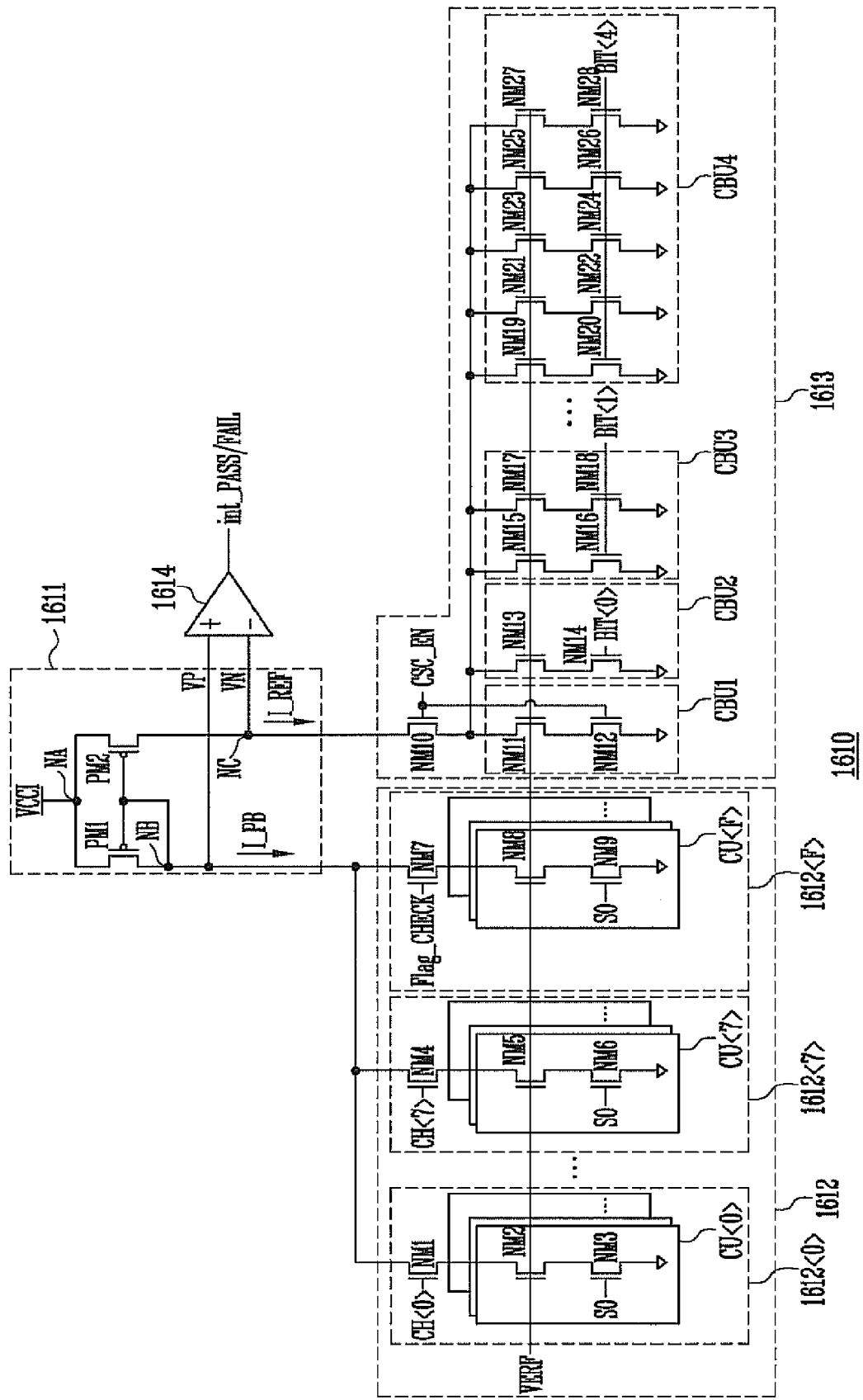
FIG. 4 is a detailed circuit diagram of a first pass/fail signal generation unit illustrated in FIG. 3.

FIG. 4 is a detailed circuit diagram of the first pass/fail signal generation unit of FIG. 3.

Referring to FIG. 4, the first pass/fail signal generation unit 1610 includes a reference current supply circuit 1611, a first ammeter shunt circuit 1612, a second ammeter shunt circuit 1613 and a comparator 1614.

The reference current supply circuit 1611 may include PMOS transistors PM1 and PM2. The PMOS transistor PM1 is coupled between a first node NA and a second node NB to which a power source voltage VCCI is applied. The PMOS transistor PM2 is coupled between the first node NA and a third node NC. Gates of the PMOS transistor PM1 and the PMOS transistor PM2 are coupled to the second node NB.

The first ammeter shunt circuit 1612 is coupled between the second node NB of the reference current supply circuit 1611 and a ground terminal. The first ammeter shunt circuit 1612 includes a plurality of ammeter shunt units 1612<0> to 1612<7> corresponding to the plurality of page buffer groups CH0 to CH7, respectively, and an ammeter shunt unit 1612<F> corresponding to the flag cell page buffer group FCH. Since the plurality of ammeter shunt units have similar configurations to each other, just one of the ammeter shunt units will be described as an example.

The ammeter shunt unit 1612<0> may include an NMOS transistor NM1 coupled to the second node NB and a plurality of ammeter shunt circuits CU<0> coupled in parallel between the NMOS transistor NM1 and a ground terminal. The NMOS transistor NM1 is turned on in response to the group selection signal CH<0> for selecting a page buffer group. Each of the ammeter shunt circuits CU<0> may include NMOS transistors NM2 and NM3. The NMOS transistor NM2 is turned on in response to the reference verify voltage VREF, and the NMOS transistor NM3 is turned on according to the potential of the sense node SO of the corresponding page buffer.

The number of ammeter shunt circuits CU<0> is substantially the same as the number of page buffers included in a single page buffer group. The ammeter shunt circuits CU<0> are coupled in parallel between the NMOS transistor NM1 and the ground terminal. Here, the ammeter shunt circuits CU<0> correspond to the page buffers, respectively.

The ammeter shunt units 1612<0> to 1612<7> and 1612<F> are coupled to the second node NB in response to the group selection signals CH<7;0> and Flag_CHECK, respectively. A current path flowing from the second node NB to the ground terminal is formed depending on the potentials of the sense nodes SO of the corresponding page buffers.

The second ammeter shunt circuit 1613 is coupled between the third node NC of the reference current supply circuit 1611 and the ground terminal. The second ammeter shunt circuit 1613 may include an NMOS transistor NM10 and a plurality of ammeter shunt circuits CBU1 to CBU4.

The NMOS transistor NM10 is coupled to the third node NC of the reference current supply circuit 1611 and is turned on in response to an enable signal CSC_EN.

The ammeter shunt CBU1 is coupled between the NMOS transistor NM10 and the ground terminal. The ammeter shunt CBU1 may include an NMOS transistor NM11 and an NMOS transistor NM12. The NMOS transistor NM11 is turned on in response to the reference verify voltage VREF. The NMOS transistor NM12 is turned on in response to the enable signal CSC_EN. According to an example, the NMOS transistor NM12 may have a smaller size than other NMOS transistors (e.g., NM3, NM6, and NM9) used in the ammeter shunt units 1612<0> to 1612<7> and 1612<F>, so that the amount of current flowing through the ammeter shunt CBU1 may be smaller than the amount of current flowing through a single ammeter shunt circuit (e.g., CU<0>).

The ammeter shunt CBU2 is coupled between the NMOS transistor NM10 and the ground terminal. The ammeter shunt CBU2 may include an NMOS transistor NM13 and an NMOS transistor NM14. The NMOS transistor NM13 is turned on in response to the reference verify voltage VREF, and the NMOS transistor NM14 is turned on in response to an allowed bit BIT<0>. The ammeter shunt CBU2 is activated when the number of allowed bits is 1 bit.

The ammeter shunt CBU3 is coupled between the NMOS transistor NM10 and the ground terminal. The ammeter shunt CBU3 may include a plurality of NMOS transistors NM15 to NM18. The NMOS transistor NM15 and NM16 are coupled in series between the NMOS transistor NM10 and the ground terminal. The NMOS transistor NM15 is turned on in response to the reference verify voltage VREF, and the NMOS transistor NM16 is turned on in response to an allowed bit BIT<1>. In addition, the NMOS transistors NM17 and NM18 are coupled in series between the NMOS transistor NM10 and the ground terminal. The NMOS transistor NM17 is turned on in response to the reference verify voltage VREF, and the NMOS transistor NM18 is turned on in response to an allowed bit BIT<1>. The ammeter shunt CBU3 is activated when the number of allowed bits is 2 bits.

As described above, as for the ammeter shunt, the number of current paths to be formed increases according to the number of allowed bits. In this embodiment of the present invention, the ammeter shunt forms five current paths, that is, the ammeter shunt is activated when the number of allowed bits is 2 bits. However, the present invention is not limited thereto and the number of allowed bits may be reduced or increased.

The comparator 1614 compares a potential VP of the second node NB of the reference current supply circuit 1611 with a potential VN of the third node NC to output the internal pass/fail signal int_PASS/int_FAIL.

For example, if, as a result of the comparison, the amount of current I_PB flowing through the first ammeter shunt circuit 1612 is smaller than the amount of current I_REF flowing through the second ammeter shunt circuit 1613, the potential VP of the second node NB is greater than the potential VN of the third node NC, and thus the comparator 1614 outputs the internal pass signal int_PASS at a high level (that is, a logic high level). If, as a result of the comparison, the amount of current I_PB flowing through the first ammeter shunt circuit 1612 is greater than the amount of current I_REF flowing through the second ammeter shunt circuit 1613, the potential VP of the second node NB is smaller than the potential VN of the third node NC, and thus the comparator 1614 outputs the internal fail signal int_FAIL at a low level (that is, a logic low level).

Figure 5:
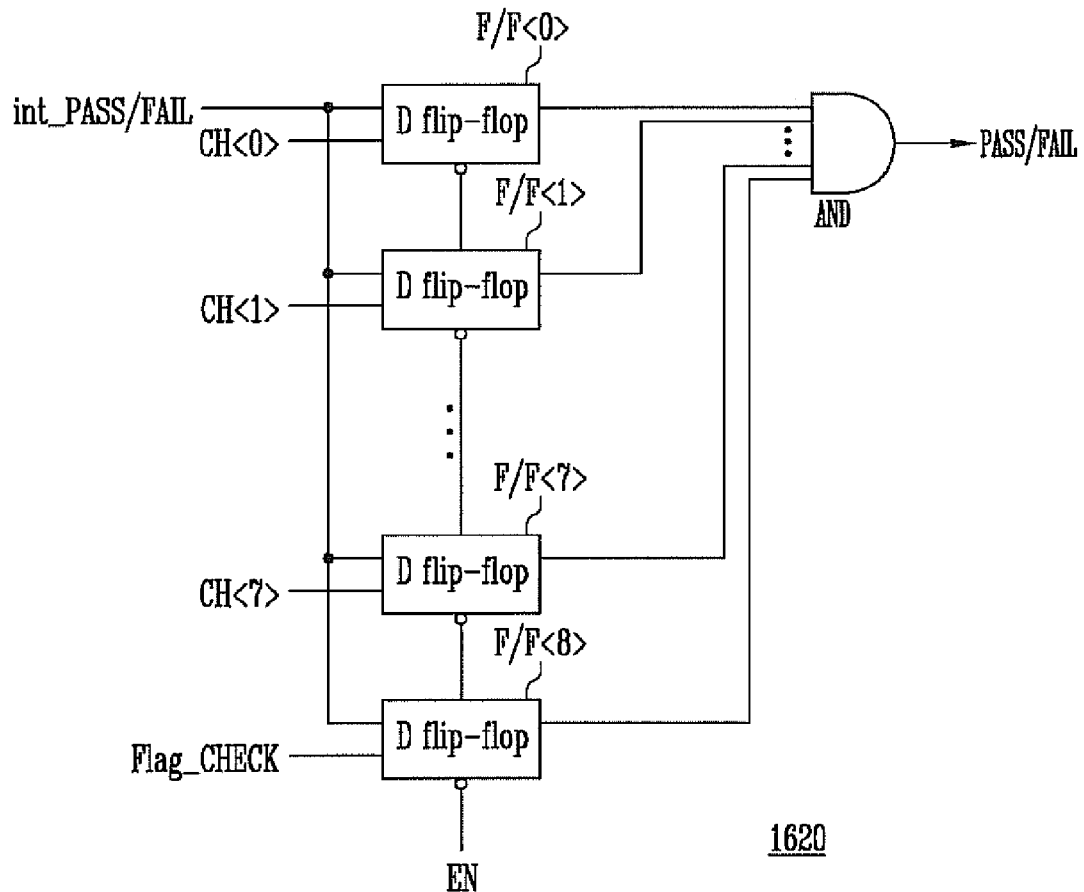
FIG. 5 is a detailed circuit diagram of a second pass/fail signal generation unit illustrated in FIG. 3.

FIG. 5 is a detailed circuit diagram of the second pass/fail signal generation unit of FIG. 3.

Referring to FIG. 5, the second pass/fail signal generation unit 1620 includes a plurality of D flip-flops F/F<0> to F/F<8> and a logic gate AND.

The plurality of D flip-flops F/F<0> to F/F<8> receive the internal pass or fail signal int_PASS or int_FAIL output from the first pass/fail signal generation unit 1610 and output the internal pass or fail signal int_PASS or int_FAIL in response to the group selection signals CH<0> to CH<7> and Flag_CHECK, respectively, without changing a logic level thereof. In addition, the D flip-flops F/F<0> to F/F<8> each initialize a logic level of an output signal to a high level before the group selection signals CH<0> to CH<7> and Flag_CHECK are input. After the group selection signal CH<0> to CH<7> and Flag_CHECK are input, the D flip-flops F/F<0> to F/F<8> each maintain the logic level of the output signal of when the group selection signals CH<0> to CH<7> and Flag_CHECK are input.

For example, the D flip-flop F/F<0> may output an output signal at a high level before the group selection signal CH<0> is input, output the output signal at a high level when the internal pass signal int_PASS at the high level and the group selection signal CH<0> at a high level are input, and continue to output the output signal at a high level when the group selection signal CH<0> transitions from a high level to a low level.

On the other hand, when the internal fail signal int_FAIL at the low level and the group selection signal CH<0> at the high level are input, the D flip-flop F/F<0> may transition the output signal from high level to low level and output the output signal at a low level. When the group selection signal CH<0> shifts from high level to low level, the D flip-flop F/F<0> may continue to output the output signal at a low level.

The logic gate AND performs a logic combination on the output signals from the plurality of D flip-flops F/F<0> to F/F<8> to output the pass/fail signal PASS/FAIL. A logic gate AND may be formed of an AND gate. When each of the output signals from the plurality of D flip-flops F/F<0> to F/F<8> is at a high level, the logic gate AND outputs the pass signal PASS at a high level. When at least one of the output signals from the plurality of D flip-flops F/F<0> to F/F<8> is at a low level, the logic gate AND outputs the fail signal FAIL at a low level.

Figure 6:
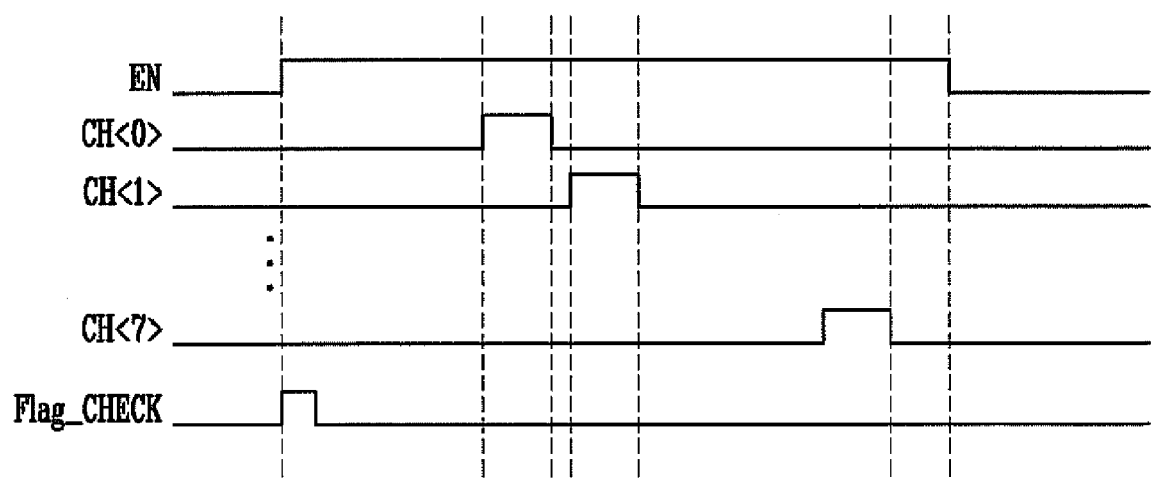
FIG. 6 is a waveform showing signals to illustrate operations of the non-volatile memory device of FIG. 1.

FIG. 6 is a waveform showing signals to illustrate operations of the non-volatile memory device of FIG. 1.

Figure 7:
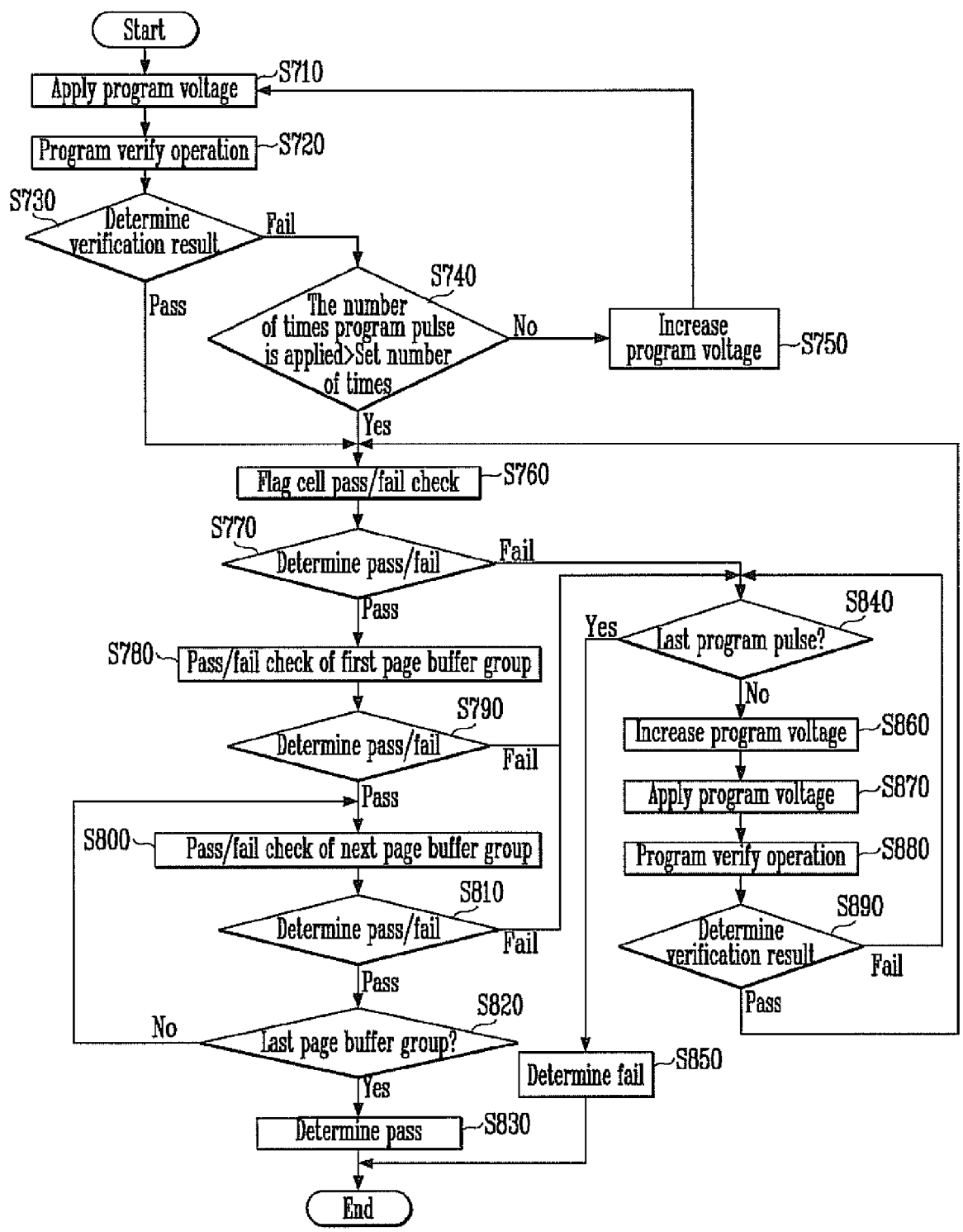
FIG. 7 is a flowchart illustrating a method of operating a non-volatile memory device according to an embodiment of the present invention.

FIG. 7 is a flowchart illustrating a method of operating a non-volatile memory device according to an embodiment of the present invention.

A method of operating a non-volatile memory device according to an embodiment of the present invention is described below with reference to FIGS. 1 to 7.

1) Apply program voltage at step S710

After program data is stored in the plurality of page buffers PB0 to PBn+k and the plurality of flag page buffers FPB0 to FPBi of the page buffer section 1500, potentials of relevant bit lines are changed into potentials corresponding to the program data. Subsequently, a program voltage is applied to the word lines of the memory block 1100 so that the memory cells of the normal memory cell array and the flag cells of the flag cell array are programmed.

2) Program verify operation at step S720

A program state of the corresponding memory cells is verified by using the plurality of page buffers PB0 to PBn+k and the plurality of flag page buffers FPB0 to FPBi of the page buffer section 1500.

3) Determine verification result at step S730

If a result of the above-described program verify operation at step S720 indicates that there is at least one memory cell that has not been programmed, a program verification result is determined to indicate a fail. If a result of the above-described program verify operation at step S720 indicates that every memory cell has been programmed, a program verification result is determined to indicate a pass. A flag cell pass/fail check operation at step S760 to be described below is performed when it is determined that the program verification result indicates a pass.

4) Compare the Number of Times Program Pulse is Applied at Step S740

When the program verification result is determined to indicate a pass at step S730 as described above, the number of times a program pulse is applied is counted, and the counted number of times is compared with a set number of times at step S740. According to an Incremental Step Pulse Program (ISPP) scheme that applies a program pulse by gradually increasing the program pulse during a program operation of a non-volatile memory device, a pass/fail check operation is skipped until the program pulse is applied for an initially set number of times that the program pulse is to be applied, thereby increasing operating speed.

5) Increase program voltage at step S750

When it is determined that the number of times the program pulse is applied is equal to or smaller than the set number of times at step S740, the above-described program voltage applying step (S710) is repeated by increasing the program voltage by a step voltage.

6) Flag cell pass/fail check operation at step S760

A pass/fail check operation is performed on the flag cells when it is determined that the number of times the program pulse is applied is greater than the set number of times at step S740 and when it is determined that the verification result indicates a pass at S730.

The flag cell pass/fail check operation at step S740 is described below in detail.

First, the potentials of the sense nodes SO of the flag page buffers FPB0 to FPBi are controlled according to the verify data stored in the latches of the flag page buffers FPB0 to FPBi coupled to the bit lines of the flag cell array.

Subsequently, the first pass/fail signal generation unit 1610 of the pass/fail check circuit 1600 couples the second node NB to a plurality of ammeter shunt circuits CU<F> coupled to the sense nodes SO of the plurality of flag page buffers FPB0 to FPBi in response to the group selection signal Flag_CHECK. The plurality of ammeter shunt circuits CU<F> form or cut off a current path in response to the reference verify voltage VREF and the potentials of the sense nodes SO.

The comparator 1614 compares the amount of current I_PB flowing through the first ammeter shunt circuit 1612 with the amount of current I_REF flowing through the second ammeter shunt circuit 1613 to output the internal pass/fail signal int_PASS/int_FAIL. At this point, if the program operation of at least one flag cell is determined to be a fail as a result of the pass/fail check operation of the flag cell array, the comparator 1614 outputs the internal fail signal int_FAIL.

Flag cells store critical information including program states and the number of times that program has been performed in association with a memory cell block. Thus, error correction may not be performed because even a 1-bit fail can significantly affect a non-volatile memory device. Therefore, the second ammeter shunt circuit 1613 disables each of the allowed bits BIT<0> to BIT<4> to a low level.

The second pass/fail signal generation unit 1620 performs a logic combination of the output signals at a high level from the plurality of D flip-flop F/F<0> to F/F<7> and the output signal from the D flip-flop F/F<F> to thereby output the pass or fail signal PASS or FAIL. If the first pass/fail signal generation unit 1610 outputs the internal pass signal int_PASS at a high level during the pass/fail check operation on the flag cells, the second pass/fail signal generation unit 1620 outputs the pass signal PASS at a high level. When the first pass/fail signal generation unit 1610 outputs the internal fail signal int_FAIL at a low level, the second pass/fail signal generation unit 1620 outputs the fail signal FAIL at a low level.

7) Determine pass/fail at step S770

The control circuit 1200 determines a result of the pass/fail check operation performed on the flag cells in response to the pass or fail signal PASS or FAIL output from the pass/fail check circuit 1600.

8) Pass/fail check of first page buffer group at step S780

When it is determined that the result of the pass/fail determination at step S770 indicates a pass, a pass/fail check operation is performed on the first page buffer group CH0, which is described below.

First, the potentials of the sense nodes SO of the page buffers PB0 to PBk are controlled depending on the verify data stored in the latches of the page buffers PB0 to PBk of the first page buffer group CH0 coupled to the bit lines of the normal memory cell array.

Subsequently, the first pass/fail signal generation unit 1610 of the pass/fail check circuit 1600 couples the second node NB to the plurality of ammeter shunt circuits CU<0> coupled to the sense nodes SO of the first page buffer group CH0 in response to the group selection signal CH<0>. The plurality of ammeter shunt circuits CU<0> form or cut off a current path in response to the reference verify voltage VREF and the potentials of the sense nodes SO. The comparator 1614 compares the amount of current I_PB flowing through the first ammeter shunt circuit 1612 with the amount of current I_REF flowing through the second ammeter shunt circuit 1613 to output the internal pass/fail signal int_PASS/int_FAIL.

The amount of current I_REF flowing through the second ammeter shunt circuit 1613 changes with the number of allowed bits. Therefore, when the number of verify data determined to indicate a fail, among the verify data stored in the page buffers of the first page buffer group CH0, is greater than the number of allowed bits, the amount of current I_PB flowing through the first ammeter shunt circuit 1612 becomes greater than the amount of current I_REF flowing through the second ammeter shunt circuit 1613. As a result, the comparator 1614 outputs the internal fail signal int_FAIL at a low level.

On the other hand, when the number of verify data determined to indicate a fail, among the verify data stored in the page buffers of the first page buffer group CH0, is smaller than the number of allowed bits, the amount of current I_PB flowing through the first ammeter shunt circuit 1612 becomes smaller than the amount of current I_REF flowing through the second ammeter shunt circuit 1613. As a result, the comparator 1614 outputs the internal pass signal int_PASS at a high level.

The second pass/fail signal generation unit 1620 performs a logic combination of the output signal of the D flip-flop F/F<0>, the output signals at a high level from the plurality of D flip-flop F/F<1> to F/F<7>, and the output signal from the D flip-flop F/F<F> having output the output signal at a high level since the pass/fail check operation performed on the previous flag cells, thereby outputting the pass or fail signal PASS or FAIL. When the first pass/fail signal generation unit 1610 outputs the internal pass signal int_PASS at a high level as a result of the pass/fail check operation on the first page buffer group, the second pass/fail signal generation unit 1620 outputs the pass signal PASS at a high level. On the other hand, when the first pass/fail signal generation unit 1610 outputs the internal fail signal int_FAIL at a low level, the second pass/fail signal generation unit 1620 outputs the fail signal FAIL at a low level.

9) Determine pass/fail at step S790

The control circuit 1200 determines a result of the pass/fail check operation on the first page buffer group CH0 in response to the pass or fail signal PASS or FAIL output from the pass/fail check circuit 1600. When the result of the pass/fail check operation on the first page buffer group CH0 is determined to indicate a fail, a program pulse check step (S840) to be described below is performed.

10) Pass/fail check of next page buffer group at step S800

When it is determined that the result of the pass/fail check operation indicates a pass at step S790, the pass/fail check operation is performed on the next page buffer group. The pass/fail check operation on the next page buffer group is substantially the same as the above-described pass/fail check operation on the first page buffer group. Therefore, a redundant description of this pass/fail check operation is omitted for simplicity.

11) Determine pass/fail at step S810

The control circuit 1200 determines a result of the pass/fail check operation on the next page buffer group in response to the pass or fail signal PASS or FAIL output from the pass/fail check circuit 1600.

12) Check whether page buffer group on which pass/fail check operation is performed is the last page buffer group at step S820

When it is determined that a result of the pass/fail check operation indicates a pass at step S810, it is determined whether the next page buffer group on which the pass/fail check operation is performed at step S800 is the last page buffer group CH<7>. When it is determined that the next page buffer group on which the pass/fail check operation is performed at step S800 is not the last page buffer group CH<7>, the process flow returns to step S800 at which the pass/fail check operation is performed on the next page buffer group as described above.

13) Determine pass/fail check operation to indicate pass at step S830

When the next page buffer group on which the pass/fail check operation is performed at step S800 is the last page buffer group CH7, it is determined that the result of the pass/fail check operation indicates a pass, and the program operation is completed.

14) Check program pulse at step S840

When it is determined that the result of pass/fail determination at step S770, S790 and S820 indicates a fail, it is determined whether the program pulse applied during the previous operation of applying a program pulse is the last program pulse in the ISPP.

15) Determine pass/fail check operation to indicate fail and complete program operation step S850

When it is determined that the program pulse applied during the previous operation of applying a program pulse is the last program pulse applied in the ISPP at the program pulse check step (S850), it is determined the result of the pass/fail check operation indicates a fail, and the program operation is completed. When the result of the pass/fail check operation is determined to indicate a fail, the corresponding memory block is processed as a failed memory block, which prevents further program, read and erase operations from being performed on the non-volatile memory device.

16) Increase program voltage at step S860

When it is determined that the program pulse applied during the previous program pulse applying operation is not the last program pulse at the program pulse check step (S850), the program voltage used during the previous program voltage applying operation is increased by a step voltage.

17) Program verify operation at step S870

After the program voltage is increased at step S860 as described above, a program state of the corresponding memory cells is verified by using the plurality of page buffers PB0 to PBn+k of the page buffer section 1500.

18) Determine verification result at step S880

It is determined that a program verification result indicates a fail if, as a result of the program verify operation at step S870, there is at least one memory cell that has not been programmed. When it is determined that every memory cell has been programmed, it is determined that the program verification result indicates a pass.

When it is determined that the program verification result indicates a pass, the process flow returns to the flag cell pass/fail check operation at step S760. When it is determined that the program verification result indicates a fail, the process flow returns to the program pulse check step (S840).

As set forth above, according to the embodiment of the present invention, during the pass/fail check operation, when the page buffer group determined to be a fail is detected during the pass/fail check operation on the flag cell page buffer group and the first to eighth page buffer groups, the pass/fail check operation on the remaining page buffer groups can be skipped to thereby improve the operating speed of the non-volatile memory device.

According to an embodiment of the present invention, a pass/fail check operation is performed on a plurality of page buffers groups in a sequential manner, and when at least one of the page buffer groups is determined to be a fail, the pass/fail check operation on the remaining page buffers groups can be skipped to thereby reduce an operating time.

What is claimed is:
1. A non-volatile memory device, comprising:
a memory cell block including a plurality of memory cells;
a plurality of page buffer groups including a plurality of page buffers coupled to bit lines of the memory cell block;
a pass/fail check circuit coupled to the plurality of page buffers and configured to perform a pass/fail check operation of comparing a total amount of current varying according to verify data sensed from the memory cells and stored in the page buffers with an amount of reference current corresponding to the number of allowed bits; and
a control circuit configured to control the pass/fail check circuit by stopping, when a fail signal is generated during the pass/fail check operation currently being performed on a page buffer group among the plurality of page buffer groups, the pass/fail check operation on the remaining page buffer groups during a period that the pass/fail check operation is to be sequentially performed on the plurality of page buffers.

2. The non-volatile memory device of claim 1, wherein the memory cell block includes a normal memory cell array and a flag cell array.

3. The non-volatile memory device of claim 2, wherein the plurality of page buffer groups further include a flag page buffer group including flag page buffers.

4. The non-volatile memory device of claim 3, wherein the pass/fail check circuit is configured to perform the pass/fail check operation on the flag page buffer group before performing the pass/fail check operation on the plurality of page buffer groups.

5. The non-volatile memory device of claim 4, wherein the control circuit is configured to skip the pass/fail check operation on the plurality of page buffer groups when it is determined that a result of the pass/fail check operation on the flag page buffer group indicates a fail.

6. The non-volatile memory device of claim 1, wherein the pass/fail check circuit comprises:
a first pass/fail signal generation unit configured to sequentially select the plurality of page buffer groups and generate an internal pass/fail signal corresponding to each of the page buffer groups selected sequentially by comparing an amount of current varying according to a potential of a sense node of each selected page buffer group with the amount of reference current; and
a second pass/fail signal generation unit configured to output a pass/fail signal in response to the internal pass/fail signal corresponding to each selected page buffer, the second pass/fail signal generation unit configured to output the fail signal when at least one of the internal pass and fail signals is determined to indicate a fail.

7. The non-volatile memory device of claim 6, wherein the first pass/fail signal generation unit comprises:
a first ammeter shunt circuit including a plurality of ammeter shunts provided between a power source and a ground and configured to shunt a current supplied from the power source according to the potential of the sense node of each selected page buffer group;
a second ammeter shunt circuit including a plurality of ammeter shunts provided between the power source and the ground and configured to shunt the current supplied from the power source in response to a bit signal based on the allowed bits that are correctable among data read through the plurality of page buffers; and
a comparator comparing a first voltage controlled by the first ammeter shunt circuit with a second voltage controlled by the second ammeter shunt circuit to generate the internal pass/fail signal.

8. The non-volatile memory device of claim 6, wherein each of the plurality of page buffers is configured to control the potential of the sense node according to the verify data.

9. The non-volatile memory device of claim 6, wherein the second pass/fail signal generation unit comprises a plurality of flip-flop units configured to generate output signals in response to the internal pass/fail signal and a plurality of group selection signals; and
a logic gate configured to output the pass/fail signal in response to the output signals from the plurality of flip-flop units.

10. The non-volatile memory device of claim 9, wherein the logic gate is configured to output the fail signal between the pass signal and the fail signal when at least one of the output signals from the plurality of flip-flop units corresponds to the fail signal.

11. The non-volatile memory device of claim 6, wherein the control circuit is configured to stop the pass/fail check operation sequentially performed when the pass/fail signal is determined to indicate a fail.

12. A non-volatile memory device, comprising:
a memory cell block including a normal memory cell array and a flag cell array;
a page buffer section including a plurality of page buffer groups coupled to the normal memory cell array and a flag page buffer group coupled to the flag cell array;
a pass/fail check circuit coupled to the page buffer section and configured to sequentially perform a pass/fail check operation on the flag page buffer group and the plurality of page buffer groups; and
a control circuit configured to control the pass/fail check circuit by stopping, when a page buffer group determined to be a fail is detected among the plurality of page buffer groups during the pass/fail check operation on the flag page buffer group and the plurality of page buffer groups, the pass/fail check operation on the remaining page buffer groups.

13. The non-volatile memory device of claim 12, wherein the plurality of page buffer groups and the flag page buffer group each include a plurality of page buffers, and each of the page buffers is configured to store verify data based on a program state of corresponding memory cells during the pass/fail check operation and control a potential of a sense node according to the verify data.

14. The non-volatile memory device of claim 13, wherein the pass/fail check circuit comprises:
a first pass/fail signal generation unit configured to sequentially select the plurality of page buffer groups and generate an internal pass/fail signal corresponding to each of the page buffer groups selected sequentially by comparing an amount of current varying according to the potential of the sense node of each selected page buffer group with an amount of reference current; and
a second pass/fail signal generation unit configured to output a pass/fail signal in response to the internal pass/fail signal corresponding to each selected page buffer group, the second pass/fail signal generation unit configured to output the fail signal when at least one of the internal pass and fail signals is determined to indicate a fail.

15. The non-volatile memory device of claim 14, wherein the first pass/fail signal generation unit comprises:
a first ammeter shunt circuit including a plurality of ammeter shunts provided between a power source and a ground and configured to shunt a current supplied from the power source according to the potential of the sense node of a page buffer group selected from among the plurality of page buffer groups;
a second ammeter shunt circuit including a plurality of ammeter shunts provided between the power source and the ground and configured to shunt the current supplied from the power source in response to a bit signal based on allowed bits; and
a comparator configured to generate the internal pass/fail signal by comparing a first voltage controlled by the first ammeter shunt circuit with a second voltage controlled by the second ammeter shunt circuit.

16. The non-volatile memory device of claim 14, wherein the second pass/fail signal generation unit comprises:
a plurality of flip-flop units configured to generate output signals in response to the internal pass/fail signal and a plurality of group selection signals; and a logic gate configured to output the pass/fail signal in response to the output signals from the plurality of flip-flop units.

17. The non-volatile memory device of claim 16, wherein the logic gate is configured to output the fail signal between the pass and fail signals when at least one of the output signals from the plurality of flip-flop units corresponds to the fail signal.

18. The non-volatile memory device of claim 14, wherein the control circuit is configured to stop the pass/fail check operation performed sequentially when the pass/fail signal is determined to indicate a fail.

19. A method of operating a non-volatile memory device, the method comprising:
   storing verify data of memory cells included in pages of a memory cell block in a plurality of page buffer groups;
   performing a pass/fail check operation by selecting the plurality of page buffer groups in a sequential manner; and
   stopping, when a page buffer groups determined to be a fail is detected among the plurality of page buffer groups during the pass/fail check operation, the pass/fail check operation on the remaining page buffer groups.

20. The method of claim 19, further comprising, when the page buffer group determined to be a fail is detected:
   checking whether a program pulse applied during a program operation of the memory cell block is the last program pulse to be applied in an Incremental Step Pulse Program (ISPP);
   defining the memory cell block as a failed memory cell block when it is determined that the program pulse applied during the program operation of the memory cell block is the last program pulse in the ISPP; and
   repeating the program operation on the memory cell block by increasing the program pulse by a step voltage when it is determined that the program pulse applied during the program operation on the memory cell block is not the last program pulse in the ISPP.

21. The method of claim 19, wherein a program operation and a program verify operation are performed on the memory cell block before the verify data is stored in the plurality of page buffer groups.

* * * * *